United States Patent [19]

Maggi

[11] 4,256,976
[45] Mar. 17, 1981

[54] FOUR CLOCK PHASE N-CHANNEL MOS GATE

[75] Inventor: Sergio Maggi, Houston, Tex.

[73] Assignee: Texas Instruments Incorporated, Dallas, Tex.

[21] Appl. No.: 967,334

[22] Filed: Dec. 7, 1978

[51] Int. Cl.³ .................. H03K 17/687; H03K 17/26; H03K 17/28

[52] U.S. Cl. .................... 307/583; 307/246; 307/270; 307/DIG. 4

[58] Field of Search ............... 307/205, 251, 270, 353, 307/DIG. 4, 238, 246

[56] References Cited

U.S. PATENT DOCUMENTS

| | | | |
|---|---|---|---|
| 3,699,539 | 10/1972 | Spence | 307/DIG. 4 X |
| 3,794,856 | 2/1974 | Baker | 307/DIG. 4 X |
| 3,835,457 | 9/1974 | Yu | 307/DIG. 4 X |
| 3,898,479 | 8/1975 | Proebsting | 307/DIG. 4 X |
| 4,081,699 | 3/1978 | Hirt et al. | 307/270 |
| 4,084,106 | 4/1978 | Ullrich | 307/DIG. 4 X |

OTHER PUBLICATIONS

Chu et al., "Bootstrap Push-Pull Driver"; *IBM Tech. Discl. Bull.;* vol. 18, No. 3, pp. 710-711; 8/1975.

Primary Examiner—Larry N. Anagnos
Attorney, Agent, or Firm—Andrew J. Dillon; Leo Heiting; Mel Sharp

[57] ABSTRACT

In an N-channel MOS integrated circuit operating in response to a major-major clock having four phases, $\phi 1$, $\phi 2$, $\phi 3$ and $\phi 4$, each of which has one, but only one, other phase which does not overlap therewith, an improved gate is disclosed wherein a first one of said phases samples an input signal for retention via a capacitive device, a second one of said phases is gated according to the state of the sample retained via the capacitive device, and a third one of said phases enhances the retention of the capacitive device.

1 Claim, 3 Drawing Figures

FOUR CLOCK PHASE N-CHANNEL MOS GATE

BACKGROUND OF THE INVENTION

1. Field of the invention:

This invention relates generally to logic gates employed in N-channel MOS integrated circuits and, more particularly, but not by way of limitation, to an improved gate for use in an N-channel MOS integrated circuit operating in response to a clock having four phases, each of which has one, but only one, other phase which does not overlap therewith, the improved gate exhibiting improved response characteristics.

2. Prior Art Statement:

In general, logic gates employed in N-channel MOS integrated circuits have been designed to operate within the timing constraints inherent in a particular clock structure. For example, a gate designed to have satisfactory response characteristics in a two phase clock structure may be unable to perform satisfactorily in a four phase clock structure. Similarly, a gate which performs satisfactorily in a four phase clock structure wherein every phase has one, but only one, other phase which does not overlap therewith, may exhibit less than satisfactory performance in a four phase clock structure wherein every phase overlaps every other phase. However, for a particular type of clock structure, such as the four phase clock structure within which the present invention is designed to operate, it is generally desirable that a gate eliminate or, at least, minimize the amount of overlap between the output signal provided by the gate and the clock phases which normally do not overlap the clock phase being gated. By way of contrast, an exemplary prior art gate has been included in the drawings, together with comparative response waveforms.

SUMMARY OF THE INVENTION

An improved gate for use in an N-channel MOS integrated circuit operating in response to a clock having four phases, each of which has one, but only one other phase which does not overlap therewith, the gate comprising an input device for connecting an input signal to a capacitive device in response to a first one of said phases, a charge-discharge device responsive to the state of the capacitive device to gate a second one of said phases, a discharge device responsive to the first one of said phases to complement the operation of the charge-discharge device, and a resistive device interposed between the capacitive device and the second one of said phases to enhance the retention of the capacitive device in response to a third one of said phases.

BRIEF DESCRIPTION OF THE DRAWINGS

The various features and advantages of the present invention will be best understood by reference to the following detailed description, when read in conjunction with the accompanying drawings wherein.

DESCRIPTION OF THE PREFERRED EMBODIMENT

Figure 1:
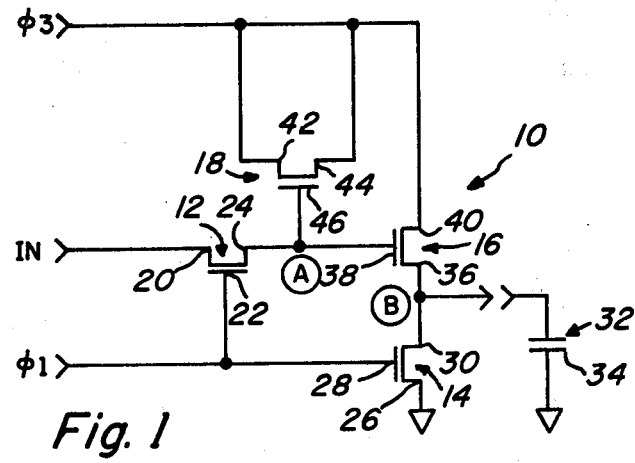
FIG. 1 is a schematic representation of a prior art gate.
Figure 3:
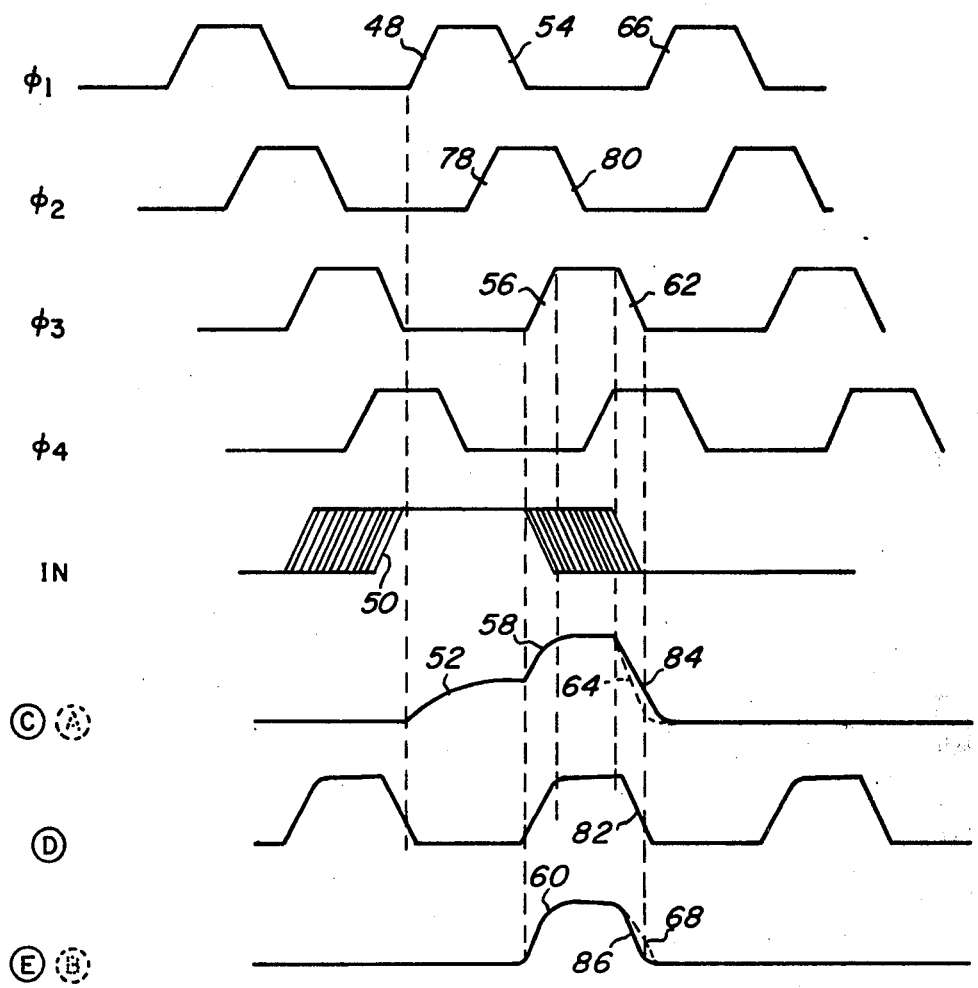
FIG. 3 is a waveform diagram illustrating the comparative operating characteristics of the gates shown in FIGS. 1 and 2.

Shown by way of example in FIG. 1 is a gate 10 which has been used in the past in N-channel MOS integrated circuits designed to operate in response to a clock having four phases, $\phi 1$, $\phi 2$, $\phi 3$ and $\phi 4$, each of which has one, but only one, other phase which does not overlap therewith, as made evident in FIG. 3. More particularly, the gate 10 is comprised of an input device 12, a discharge device 14, a charge-discharge device 16, and a capacitive device 18. The input device 12, which is of the enhancement type, has a source portion 20 connected to an input signal, a gate portion 22 connected to the $\phi 1$ clock, and a drain portion 24. The discharge device 14, which is of the enhancement type, has a source portion 26 connected to a circuit ground, a gate portion 28 connected to the $\phi 1$ clock, and a drain portion 30 providing an output signal for application to a target device 32 illustrated schematically as a capacitor 34. The charge-discharge device 16, which is of the enhancement type, has a source portion 36 connected to the drain portion 30 of the discharge device 14, a gate portion 38 connected to the drain portion 24 of the input device 12, and a drain portion 40 connected to the $\phi 3$ clock. Finally, the capacitive device 18, which is also of the enhancement type, has a source portion 42 and a drain portion 44 connected to the $\phi 3$ clock, and a gate portion 46 connected to the gate portion 38 of the charge-discharge device 16. For convenience of reference, the interconnection of the drain portion 24 of the input device 12 and the gate portions 38 and 46 of the charge-discharge device 16 and the capacitive device 18, respectively, will be referred to hereinafter as the node A, while the interconnection of the drain portion 30 of the discharge device 14 and the source portion 36 of the charge-discharge device 16 will be referred to hereinafter as the node B.

As can be seen best in FIG. 3, the input device 12 is responsive to a leading edge 48 of the $\phi 1$ clock to couple an input signal, such as that shown at 50, to the node A, so that the gate capacitances of the charge-discharge device 16 and of the capacitive device 18 will be charged, as at 52, to a voltage somewhat above the normal threshold voltage of the charge-discharge device 16. The subsequent trailing edge 54 of the $\phi 1$ clock substantially isolates the gate 38 from further transitions of the input signal. Upon the occurrence of a leading edge 56 of the $\phi 3$ clock, the voltage at the node A is further increased, as at 58, via the connection of the source and drain portions 42 and 44 of the capacitive device 18 to the $\phi 3$ clock. In response to the rapidly rising voltage applied to the gate portion 38 thereof simultaneously with the application of the leading edge 56 of the $\phi 3$ clock to the drain portion 40 thereof, the charge-discharge device 16 will rapidly couple the $\phi 3$ clock to the node B, as at 60, for application to the target device 32. Upon the occurrence of the trailing edge 62 of the $\phi 3$ clock, the voltage at the node A will drop rapidly, as shown in phantom as 64, to a level substantially nearer the threshold voltage of the charge-discharge device 16. As a consequence, the current therethrough decreases too rapidly to completely dissipate the charge at node B. Thus, substantial charge must be dissipated from node B through the discharge device 14 after the next leading edge 66 of the $\phi 1$ clock has risen above the threshold voltage of the discharge device 14. As a result, the trailing edge of the output signal, shown in phantom at 68, exhibits substantial, undesirable overlap with the leading edge 66 of the subsequent $\phi 1$ clock.

Figure 2:
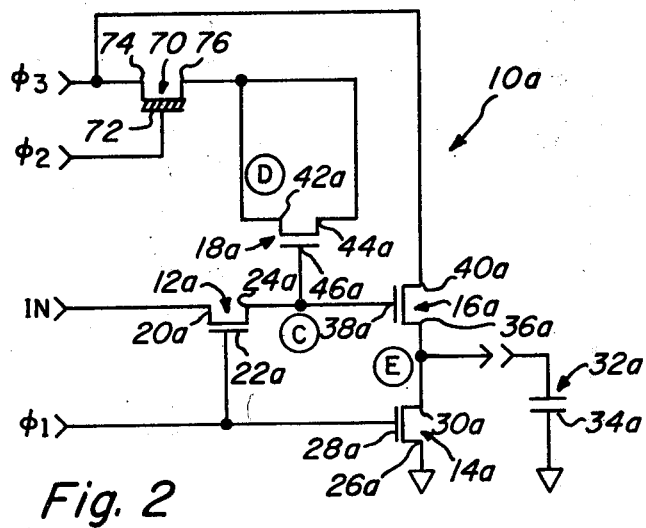
FIG. 2 is a schematic representation of the improved gate of the present invention.

Shown in FIG. 2 is an improved gate 10a constructed in accordance with the preferred embodiment of the present invention. As with the gate 10, the improved gate 10a is designed to operate in an N-channel MOS integrated circuit in response to a clock having four phases, $\phi 1$, $\phi 2$, $\phi 3$ and $\phi 4$, each of which has one, but only one, other phase which does not overlap therewith. More particularly, the gate 10a is comprised of an input device 12a, a discharge device 14a, a resistive device 70, a charge-discharge device 16a, and a capacitive device 18a. The input device 12a, which is of the enhancement type, has a source portion 20a connected to an input signal, a gate portion 22a connected to the $\phi 1$ clock, and a drain portion 24a. The discharge device 14a, which is of the enhancement type, has a source portion 26a connected to a circuit ground, a gate portion 28a connected to the $\phi 1$ clock, and a drain portion 30a providing an output signal for application to a target device 32a illustrated schematically as a capacitor 34a. The resistive device 70 which is of the depletion type, has a gate portion 72 connected to the $\phi 2$ clock, a source portion 74 connected to the $\phi 3$ clock, and a drain portion 76. The charge-discharge device 16a, which is of the enhancement type, has a source portion 36a connected to the drain portion 30a of the discharge device 14a, a gate portion 38a connected to the drain portion 24a of the input device 12a, and a drain portion 40a connected to the $\phi 3$ clock. Finally, the capacitive device 18a, which is also of the enhancement type, has a source portion 42a and a drain portion 44a connected to the drain portion 76 of the resistive device 70, and a gate portion 46a connected to the gate portion 38a of the charge-discharge device 16a. From a comparison of FIGS. 1 and 2, it can be seen that the gate 10a differs from the gate 10 in that the gate 10a includes the resistive device 70 interposed between the $\phi 3$ clock and the source and drain portions 42a and 44a, respectively, of the capacitive device 18a. For convenience of reference, the interconnection of the drain portion 24a of the input device 12a and the gate portions 38a and 46a of the charge-discharge device 16a and the capacitive device 18a, respectively, will be referred to hereinafter as the node C; the interconnection of the drain portion 76 of the resistive device 70 and the source and drain portions 42a and 44a, respectively, of the capacitive device 18a, will be referred to hereinafter as the node D; and the interconnection of the drain portion 30a of the discharge device 14a and the source portion 36a of the charge-discharge device 16a will be referred to hereinafter as the node E.

As can be seen best in FIG. 3, the input device 12a is responsive to the leading edge 48 of the $\phi 1$ clock to couple the input signal, shown as 50, to the node C, so that the gate capacitances of the charge-discharge device 16a and of the capacitive device 18a will be charged, as at 52, to a voltage somewhat above the normal threshold voltage of the charge-discharge device 16a. The subsequent trailing edge 54 of the $\phi 1$ clock substantially isolates the gate 10a from further transitions of the input signal. In the interim, however, a leading edge 78 of the $\phi 2$ clock places the resistive device 70 in the low resistance state so that, upon the occurrence of the leading edge 56 of the $\phi 3$ clock, the voltage at node A may be further increased, as at 58, through the resistive device 70 to the source and drain portions 42a and 44a of the capacitive device 18a. In response to the rapidly rising voltage applied to the gate portion 38a thereof simultaneously with the application of the leading edge 56 of the $\phi 3$ clock to the drain portion 40a thereof, the charge-discharge device 16a will rapidly couple the $\phi 3$ clock to the node E as at 60, for application to the target device 32a. Thereafter, the trailing edge 80 of the $\phi 2$ clock places the resistive device 70 in the high resistance state so that, upon the occurrence of the trailing edge 62 of the $\phi 3$ clock, the dissipation of the charge on node D, shown at 82, will be somewhat delayed relative to the trailing edge 62 of the $\phi 3$ clock, depending upon the construction of the resistive device 70. Accordingly, the voltage at node C will drop at a slower rate, as shown at 84, than in the gate 10, so that the voltage on gate portion 38a on the charge-discharge device 16a is maintained above the threshold voltage thereof for a somewhat longer period of time. As a consequence, the current therethrough is maintained sufficiently high to dissipate a major portion of the charge at node E. The remaining charge on node E may then be conveniently discharged through the discharge device 14a after the next leading edge 66 of the $\phi 1$ clock has risen above the threshold voltage of the discharge device 14a. As can be seen at 86 in FIG. 3, the trailing edge of the output signal of the gate 10a exhibits substantially less overlap with the leading edge 66 of the subsequent $\phi 1$ clock than the trailing edge 68 of the output signal of the gate 10.

Variations may be made in the construction or arrangement of the parts or elements of the preferred embodiment as disclosed herein without departing from the spirit and scope of the present invention as defined in the following claim. What is claimed is:

1. In an N-channel MOS integrated circuit operating in response to a clock having four phases, $\phi 1$, $\phi 2$, $\phi 3$ and $\phi 4$, each of which has one, but only one, other phase which does not overlap therewith, an improved gate comprising:

an input device of the enhancement type, the input device having a source portion connected to an input signal, a gate portion connected to the $\phi 1$ clock, and a drain portion;

a discharge device of the enhancement type, the discharge device having a source portion connected to a circuit ground, a gate portion connected to the $\phi 1$ clock, and a drain portion providing an output signal;

a resistive device of the depletion type, the resistive device having a gate portion connected to the $\phi 2$ clock, a source portion connected to the $\phi 3$ clock, and a drain portion;

a charge-discharge device of the enhancement type, the charge-discharge device having a source portion connected to the drain portion of the discharge device, a gate portion connected to the drain portion of the input device, and a drain portion connected to the $\phi 3$ clock; and, a capacitive device of the enhancement type, the capacitive device having source and drain portions connected to the drain portion of the resistive device, and a gate portion connected to the gate portion of the charge-discharge device.

* * * * *